United States Patent
Yang

(10) Patent No.: US 8,816,885 B2
(45) Date of Patent: Aug. 26, 2014

(54) DATA INTERFACE ALIGNMENT

(75) Inventor: Wei-Lien Yang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/537,848

(22) Filed: Jun. 29, 2012

(65) Prior Publication Data

US 2014/0002283 A1 Jan. 2, 2014

(51) Int. Cl.
*H03M 9/00* (2006.01)

(52) U.S. Cl.
USPC .......................................... 341/100; 341/101

(58) Field of Classification Search
USPC .................................... 341/100, 101
See application file for complete search history.

(56) References Cited

U.S. PATENT DOCUMENTS

| 6,970,115 | B1 | 11/2005 | Sardi et al. |
| 7,050,032 | B2* | 5/2006 | Tamura ............................ 345/98 |
| 7,474,234 | B2* | 1/2009 | Wagensohner et al. ......... 341/53 |
| 8,045,667 | B2* | 10/2011 | Lim et al. ....................... 375/371 |
| 8,112,655 | B2* | 2/2012 | Drucker et al. ................ 713/500 |
| 2001/0016929 | A1* | 8/2001 | Bonneau et al. ............... 714/735 |
| 2005/0073586 | A1* | 4/2005 | Li et al. ....................... 348/207.1 |
| 2010/0067635 | A1 | 3/2010 | Prentice |
| 2010/0150290 | A1 | 6/2010 | Kim et al. |

FOREIGN PATENT DOCUMENTS

| EP | 1814234 | 1/2011 |
| JP | 07-175740 | 7/1995 |

OTHER PUBLICATIONS

International Searching Authority, "Notification of Transmittal of the International Search Report and the Written Opinion of the International Searching Authority," mailed Oct. 28, 2013, in International application No. PCT/US2013/048048.

* cited by examiner

*Primary Examiner* — Brian Young
(74) *Attorney, Agent, or Firm* — Trop, Pruner & Hu, P.C.

(57) ABSTRACT

In one embodiment, an apparatus may include a de-serializer to convert serial data into two parallel data streams, and a control unit to provide a first update signal and a second update signal based on a bit count of the serial data. The apparatus may further include a target component having an input bus, the input bus including a first portion and a second portion. The apparatus may further include a first output unit to provide the first set of parallel data to the first portion of the input bus, and a second output unit to provide the second set of parallel data to the second portion of the input bus.

25 Claims, 8 Drawing Sheets

DATA INTERFACE ALIGNMENT

BACKGROUND

Embodiments relate generally to data interfaces for electronic devices.

Many electronic devices include multiple components coupled together by one or more data interfaces. For example, a cellular telephone may include a processor core coupled to a radio transceiver, a sound input device, a sound output device, a camera, a display device, a memory device, etc. The functionality of such components has been continually improved to meet market demands. Accordingly, the data interfaces between the components may need to be adapted to increasing bandwidth requirements.

DETAILED DESCRIPTION

In some electronic devices, data interfaces between components may have to handle different input/output transfer rates for each component. In accordance with some embodiments, input serial data from a transmitter may be de-serialized and split into two parallel data streams. In some embodiments, the two parallel data streams may be provided to a target in alternating fashion. Further, in one or more embodiments, validation indicators may be provided to the target, such that the target may ignore any parallel data not associated with a validation indicator.

Figure 1:
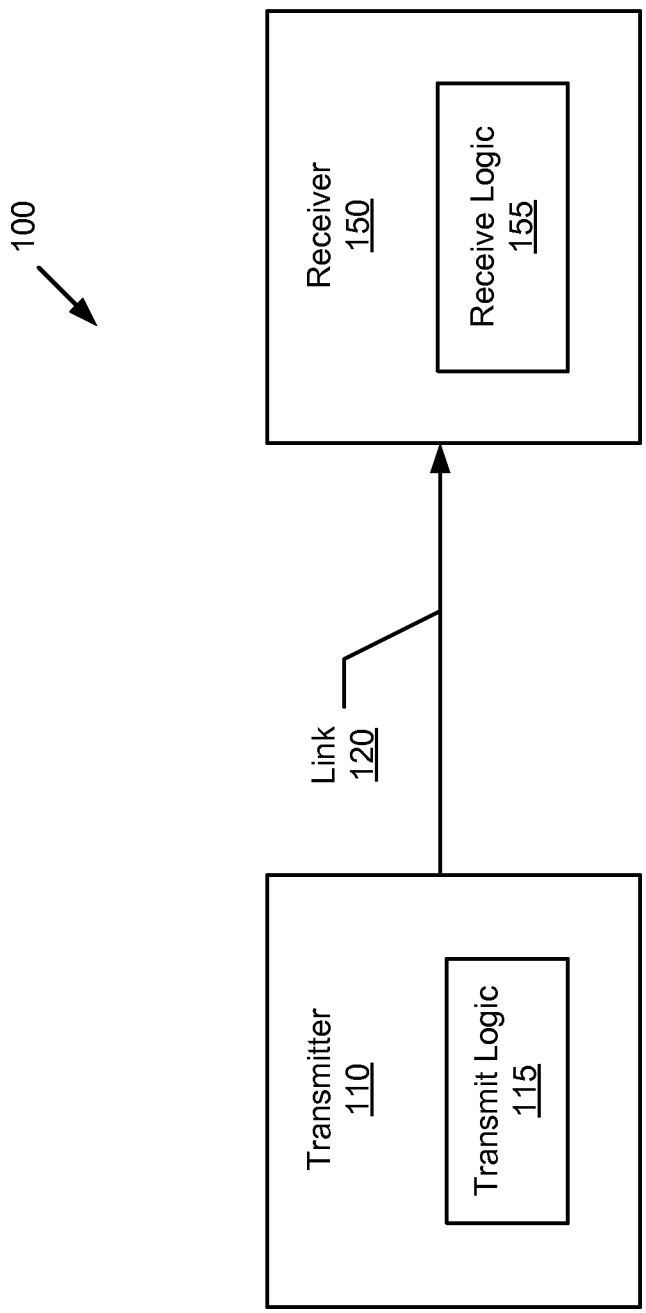
FIG. 1 is a block diagram of a system in accordance with one or more embodiments.

Referring to FIG. 1, shown is a block diagram of an apparatus 100 in accordance with one or more embodiments. As shown in FIG. 1, the apparatus 100 may include a link 120 connecting a transmitter 110 and a receiver 150. In accordance with some embodiments, the apparatus 100 may be any electronic device, such as a cellular telephone, a computer, a media player, a network device, etc.

In some embodiments, the transmitter 110 and the receiver 150 may exist to connect any components or peripherals of the apparatus 100, such as a processor, a core, a memory device, a display device, a sound device, a wireless transceiver, a camera, etc. For example, in one or more embodiments, the receiver 150 may connect to a processor having a ten bit parallel data path. Note that, while only one pair of transmitter 110 and receiver 150 is shown for the sake of clarity, the example shown in FIG. 1 is not intended to be limiting. Accordingly, it should be appreciated that any number of such transmitter-receiver pairs may exist to connect various components of the apparatus 100.

In accordance with some embodiments, the link 120 may be any electrical or data connection (e.g., motherboard connection, input/output cable, network connector, bus, wireless link, etc.). In one or more embodiments, the transmitter 110 may include transmit logic 115 to manage data connections to the receiver 150. Further, in some embodiments, the receiver 150 may include receive logic 155 to manage the data connections from the transmitter 110.

In accordance with some embodiments, the link 120, the transmit logic 115, and the receive logic 155 may use one or more data interface protocols. For example, in some embodiments, the link 120, the transmitter 110, and the receiver 150 may use the M-PHY specification of the Mobile Industry Processor Interface (MIPI) Alliance (MIPI Specification for M-PHY Version 1.00.00 of Feb. 8, 2011, approved Apr. 28, 2011). In such embodiments, the link 120 may be a serial link carrying differential pulse width modulated (PWM) signals. Optionally, the PWM signals may be referred to as "self-clocking" if clock information is included in the period of the PWM waveform.

In one or more embodiments, the PWM signals of the link 120 may operate under one or more data rate ranges of the M-PHY specification (referred to as "GEARs"). For example, the link 120 may operate under GEAR 1 (3 Mbps to 9 Mbps), GEAR 2 (6 Mbps to 18 Mbps), GEAR 3 (12 Mbps to 36 Mbps), GEAR 4 (24 Mbps to 72 Mbps), GEAR 5 (48 Mbps to 144 Mbps), GEAR 6 (96 Mbps to 288 Mbps), GEAR 7 (192 Mbps to 576 Mbps), etc.

In accordance with some embodiments, the receive logic 155 may include functionality to de-serialize (i.e., convert to parallel data) the serial data received from the transmitter 110 (i.e., the PWM signals of the link 120). Further, in some embodiments, the receive logic 155 may also include functionality to align the de-serialized data with the input bus of the receiver 150. This functionality of the receive logic 155 is described further below with reference to FIGS. 2-6.

In one or more embodiments, the transmit logic 115 and/or the receive logic 155 may be implemented in hardware, software, and/or firmware. In firmware and software embodiments, they may be implemented by computer executed instructions stored in a non-transitory computer readable medium, such as an optical, semiconductor, or magnetic storage device. While shown with this particular implementation in the embodiment of FIG. 1, the scope of the various embodiments discussed herein is not limited in this regard.

Figure 2:
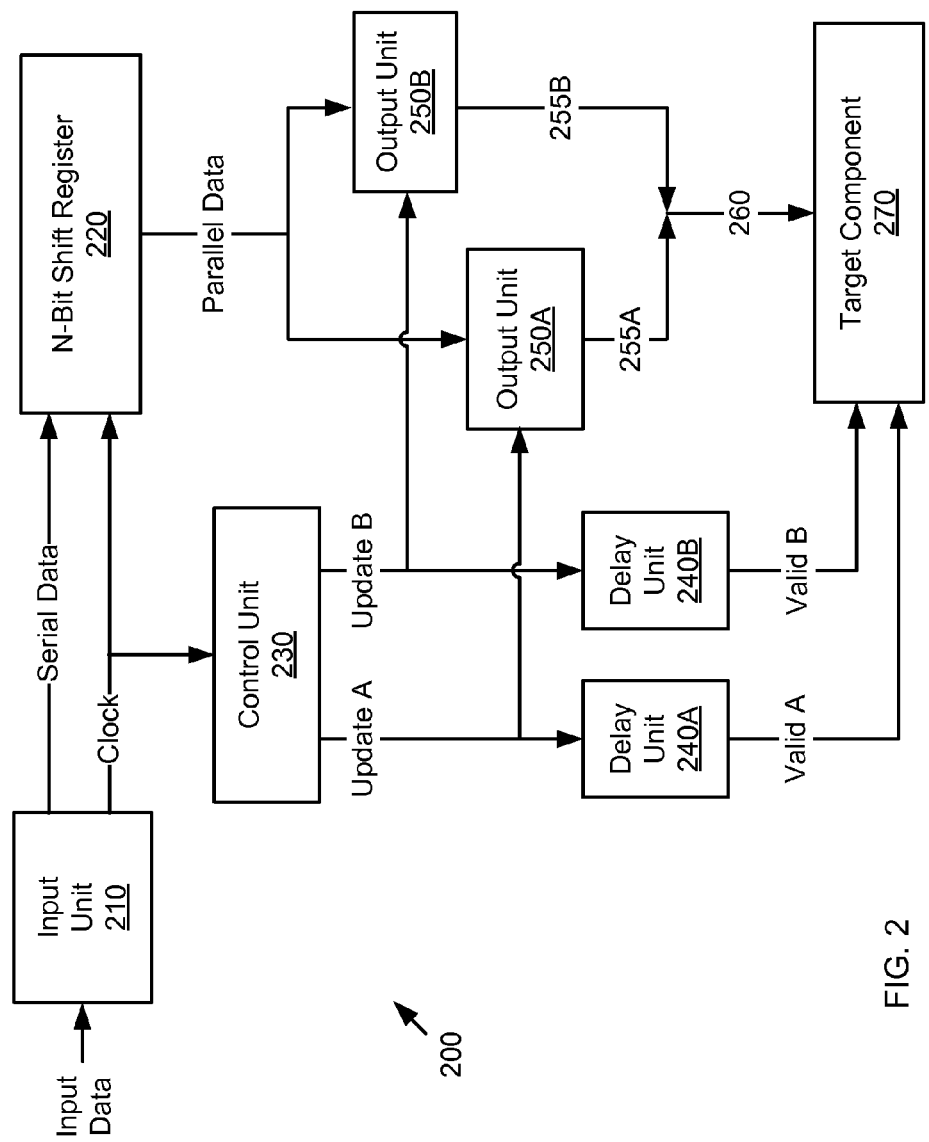
FIG. 2 is a block diagram of a system in accordance with one or more embodiments.

Referring to FIG. 2, shown is a block diagram of a receive logic 200 in accordance with one or more embodiments. More specifically, the receive logic 200 may generally correspond to all or a portion of the receive logic 155 shown in FIG. 1. As shown, an input signal may be received by the receive logic 200. In one or more embodiments, the input signal may be a PWM signal received from a transmitter 110 by way of the link 120.

In one or more embodiments, the input signal may be provided to an input unit 210, which may process the input signal to produce serial data and an associated clock signal (labeled "Clock"). For example, in some embodiments, the input unit 210 may convert differential PWM signals into a PWM single ended signal, and may then convert the PWM single ended signal into Non-Return Zero (NRZ) serial data. In such embodiments, the input unit 210 may include an amplifier. Further, in some embodiments, the input unit 210 may include functionality to analyze the waveform of self-clocking PWM signals (e.g., an edge detector) to obtain the clock signal for the serial data (e.g., a stream of pulses corresponding to the bits of data).

As shown in FIG. 2, the serial data and clock signal from the input unit 210 may be provided to an N-bit shift register 220. In one or more embodiments, the N-bit shift register 220 may operate in a Serial-In to Parallel-Out (SIPO) mode. In other words, the N-bit shift register 220 may store the serial data, one bit at a time, in response to the pulses of the clock signal. Thus, after N pulses, the N-bit shift register 220 may be filled (i.e., storing N bits of the serial data). Further, in some embodiments, the N bits stored in the N-bit shift register 220 may be read in parallel from N output terminals of the N-bit shift register 220. In this manner, the N-bit shift register 220 may operate to de-serialize the serial data into parallel data. For example, in some embodiments, the N-bit shift register 220 may be a 10 bit SIPO shift register (i.e., N=10).

As shown, the clock signal from the input unit 210 may also be provided to a control unit 230. In one or more embodiments, the control unit 230 may include functionality to count the pulses of the clock signal to determine the bit count of the serial data. Further, the control unit 230 may include functionality to provide a first update signal (labeled "Update A") upon counting N pulses of the clock signal (i.e., upon reaching a bit count equal to N). In some embodiments, the first update signal may be provided to a first output unit 250A. In response to receiving the first update signal, the first output unit 250A may read and store a first set of N bits of the parallel data output of the N-bit shift register 220 (labeled "Parallel Data"). In one or more embodiments, the first output unit 250A may provide the stored parallel data to a first N-bit bus 255A.

In one or more embodiments, the control unit 230 may also include functionality to reset the pulse count to zero after providing the first update signal, and to provide a second update signal (labeled "Update B") upon again counting N pulses of the clock signal. Further, after providing the second update signal, the control unit 230 may return to counting to again providing the first update signal. Thus, in this manner, the control unit 230 may provide the first and second update signals in alternating fashion based on reaching a count of N. An example embodiment of the control unit 230 is discussed below with reference to FIG. 3.

In accordance with some embodiments, the control unit 230 may provide the second update signal to a second output unit 250B. In response to receiving the first update signal, the second output unit 250B may read and store a second set of N bits of the parallel data output of the N-bit shift register 220. In one or more embodiments, the second output unit 250B may provide the stored parallel data to a second N-bit bus 255B. In one or more embodiments, the first output unit 250A and the second output unit 250B may each be an N-bit latch operating in a transparent mode. For example, in some embodiments, the first output unit 250A and/or the second output unit 250B may be a ten bit transparent latch.

As shown, in one or more embodiments, the first N-bit bus 255A may be coupled to a first portion of an input bus 260 of the target component 270. Further, in some embodiments, the second N-bit bus 255B may be coupled to a second portion of the input bus 260. For example, assume that N equals ten. In this example, the input bus 260 may be twenty bits wide, and the first N-bit bus 255A may provide the first ten bits of the input bus 260 (i.e., bits 1-10). Further, in this example, the second N-bit bus 255B may provide the second ten bits of the input bus 260 (i.e., bits 11-20).

In accordance with some embodiments, the control unit 230 may provide the first update signal to a first delay unit 240A, and may provide the second update signal to a second delay unit 240B. In one or more embodiments, the first delay unit 240A may include functionality to provide a first validity indicator based on the first update signal. Further, the second delay unit 240B may include functionality to provide a second validity indicator based on the second update signal. For example, in some embodiments, the first delay unit 240A may obtain the first validity indicator by delaying the first update signal for a predefined delay period (e.g., 0.1 millisecond, 1 millisecond, 5 milliseconds, etc.). In some embodiments, the first delay unit 240A may provide the first validity indicator to a first validity input of the target component 270. Similarly, the second delay unit 240B may provide the second validity indicator to a second validity input of the target component 270.

In one or more embodiments, the first validity indicator may be associated with parallel data corresponding to the first update signal (i.e., the parallel data transferred through the first output unit 250A and the first N-bit bus 255A). Similarly, the second validity indicator may be associated with parallel data corresponding to the second update signal. In one or more embodiments, a validity indicator may be associated with a set of parallel data if the validity indicator is generated by the same update signal that caused the set of parallel data to be provided to the target component 270 (i.e., from the first output unit 250A or the second output unit 250B).

In one or more embodiments, the target component 270 may include functionality to determine whether a received set of parallel data is associated with a received validity indicator. In some embodiments, such functionality may include determining whether a validity indicator is received on a validity terminal or channel that is associated with the portion of the input bus 260 that provides the set of parallel data. Further, such functionality may include determining whether the validity indicator was received within a predefined time threshold of receiving the set of parallel data. In some embodiments, the target component 270 may also include functionality to ignore any parallel data that is not received with an associated validity indicator.

For example, assume that N equals ten, and that the target component 270 is a processor that receives a set of parallel data corresponding to the first ten bits of the input bus 260 (i.e., bits 1-10). Assume further that the target component 270 also receives a validity indicator on an input terminal or a channel associated with the first ten bits of the input bus 260. In addition, assume that the validity indicator was received within a given time threshold of receiving the set of parallel data (e.g., within one millisecond). In this situation, the target component 270 may process the data received on the first ten bits of the input bus 260. Note that, in this example, the target component 270 may discard any data that may be received on the second ten bits of the input bus 260 during the same time period, as such data is not validated by the received validation indicator.

Assume further that, at a later time, the target component 270 receives a validity indicator on an input terminal or a channel associated with the second ten bits of the input bus, and also receives data on the second ten bits of the input bus 260 within the time threshold. In this situation, the target component 270 may process the data received on the second ten bits of the input bus 260. Thus, the data transfer to target component 270 may be synchronized or aligned to a transmitter having a different data transfer rate. While shown with this particular implementation in the embodiment of FIG. 2, the scope of the various embodiments discussed herein is not limited in this regard.

Figure 3:
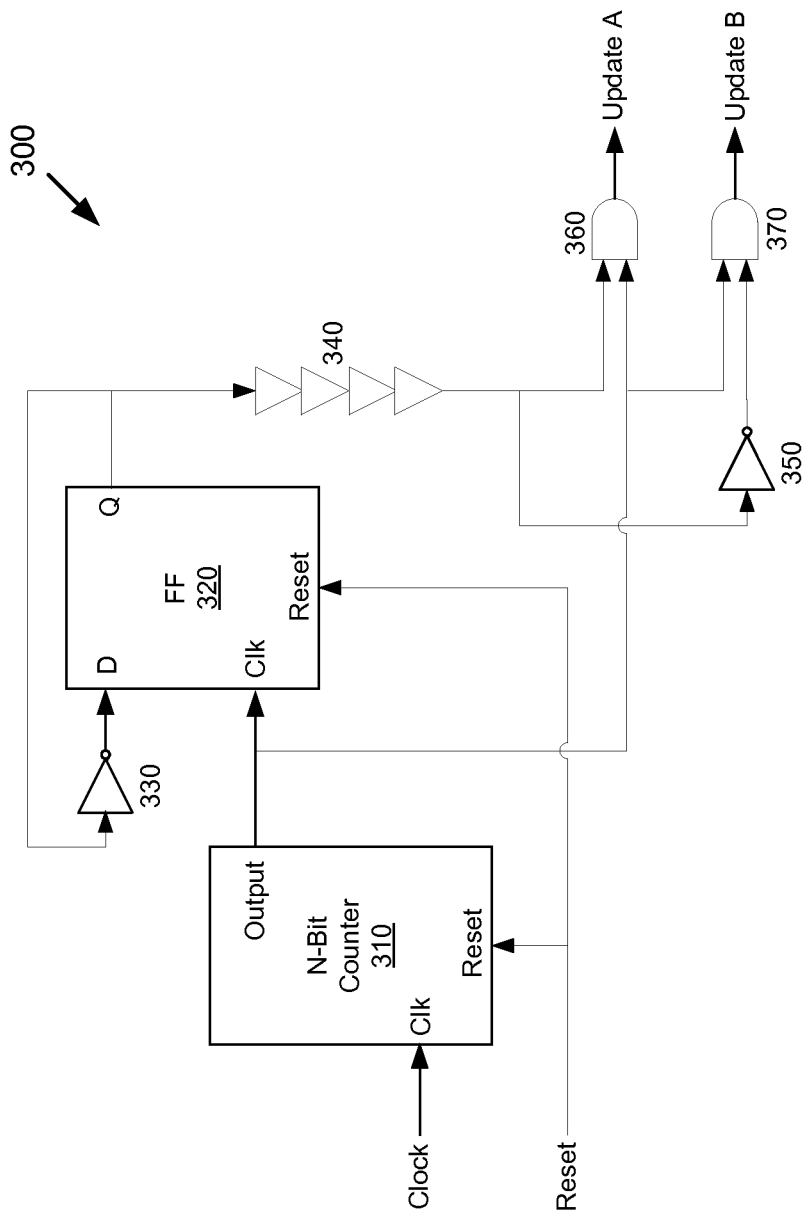
FIG. 3 is a block diagram of a system in accordance with one or more embodiments.

Referring now to FIG. 3, an example embodiment of a control unit 300 is shown in accordance with one or more embodiments. More specifically, the control unit 300 may generally correspond to all or a portion of the control unit 230 shown in FIG. 2. As shown, the control unit 300 may receive the clock signal for the serial data (described above with reference to FIG. 2). Further, in some embodiments, the control unit 300 may also receive a reset signal.

As shown in FIG. 3, in one or more embodiments, the clock signal may be provided to a clock input of an N-bit counter 310. The output signal of N-bit counter 310 may be coupled to the clock input of a flip-flop (FF) 320. In addition, the output signal of N-bit counter 310 may also be provided to a first AND gate 360 and a second AND gate 370. The reset signal may be coupled to the reset inputs of N-bit counter 310 and FF 320.

As shown, the output signal of FF 320 may be inverted by a first inverter 330 and then provided back to the data input of FF 320. Further, the output signal of FF 320 may also be coupled to an input of a delay element 340. The output of the delay element 340 may be provided, along with the output signal of N-bit counter 310, to the first AND gate 360. The output of the first AND gate 360 may be the first update signal (labeled "Update A").

As shown, the output of the delay element 340 may also be inverted by a second inverter 350 and then provided, along with the output signal of N-bit counter 310, to the second AND gate 370. The output of the second AND gate 370 may be the second update signal (labeled "Update B").

Note that the examples shown in FIGS. 1-3 are provided for the sake of illustration, and are not intended to limit any embodiments. For example, embodiments may include any number and/or arrangement of transmitters 110 and/or receivers 150. In another example, the parallel data devices described above may be implemented using any number N of parallel bits (e.g., 2, 8, 20, 50, 100, etc.). In yet another example, it is contemplated that some embodiments may include any number of components in addition to those shown, and that different arrangement of the components shown may occur in certain implementations. Further, it is contemplated that specifics in the examples shown in FIGS. 1-3 may be used anywhere in one or more embodiments.

Figure 4:
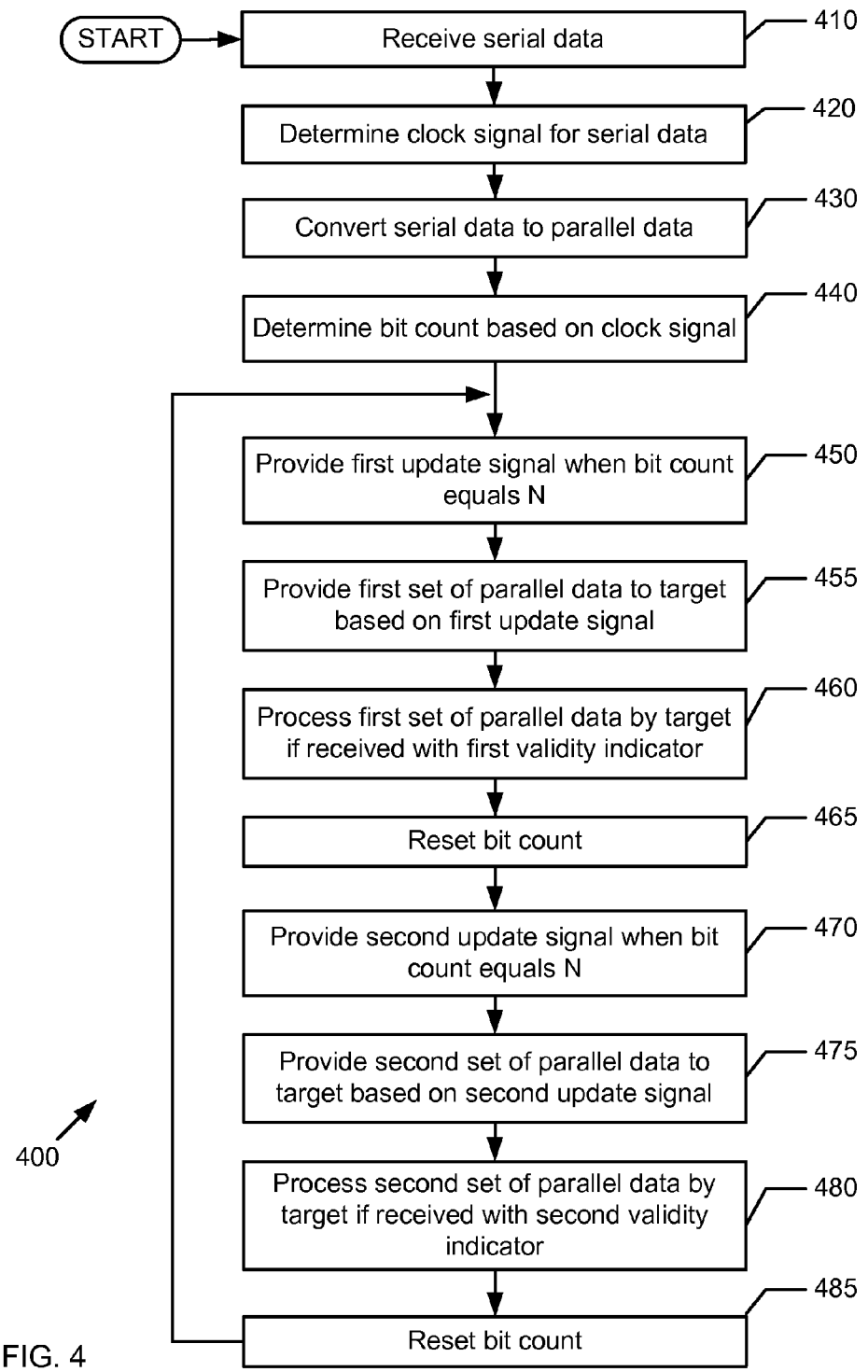
FIG. 4 is a flow chart of a method in accordance with one or more embodiments.

FIG. 4 shows a sequence 400 for data transfer in accordance with one or more embodiments. In one embodiment, the sequence 400 may be part of the receive logic 115 shown in FIG. 1. In other embodiments, the sequence 400 may be implemented by any other part of receiver 150. The sequence 400 may be implemented in hardware, software, and/or firmware. In firmware and software embodiments it may be implemented by computer executed instructions stored in a non-transitory computer readable medium, such as an optical, semiconductor, or magnetic storage device.

At step 410, serial data may be received. For example, referring to FIG. 2, the input logic 210 may receive differential PWM signals operating under the M-PHY specification. In one or more embodiments, the input logic 210 may convert the differential PWM signals into NRZ serial data.

At step 420, the clock signal for the received serial data may be determined. For example, referring to FIG. 2, the input logic 210 may analyze the waveform of the PWM signal to determine the clock rate. In one or more embodiments, the input logic 210 may use an edge detector to determine the clock rate.

At step 430, the serial data may be converted to parallel data. For example, referring to FIG. 2, the N-bit shift register 220 may store N bits of the serial data. Further, the N-bit shift register 220 may provide all N bits in a parallel output, thereby de-serializing the received data stream.

At step 440, a bit count for the serial data may be determined based on the clock rate. For example, referring to FIG. 2, the control unit 230 may count bits based on the clock rate provided by the input logic 210. In one or more embodiments, the control unit 230 may be configured to count to a predefined number N (e.g., 2, 10, 20, etc.).

At step 450, a first update signal may be provided when the bit count reaches a predefined number N. For example, referring to FIG. 2, the control unit 230 may provide the first update signal to the first output unit 250A and the first delay unit 240A when the count reaches ten bits.

At step 455, a first set of parallel data may be provided to the target component. For example, referring to FIG. 2, the first output unit 250A may receive and store the N bits of parallel data from the N-bit shift register 220 based on receiving the first update signal. Further, the first output unit 250A may provide the first set of parallel data to the first N-bit bus 255A. In some embodiments, the first N-bit bus 255A may be coupled to a first portion (e.g., bits 1-10) of the input bus 260 of the target component 270. Alternatively, in some embodiments, the first output unit 250A may provide the first set of parallel data directly to the first portion of the input bus 260. In one or more embodiments, the first output unit 250A may be a 10 bit latch.

At step 460, the first set of parallel data may be processed by a target if it is associated with a received validity indicator. For example, referring to FIG. 2, the target component 270 may determine whether a first validity indicator has been received within a given time threshold of receiving the first set of parallel data. In some embodiments, this determination may be based on receiving a predefined signal at a given terminal or by a given channel. In one or more embodiments, the target component 270 may be configured to ignore the first set of parallel data if it is not associated with the received first validity indicator.

At step 465, the bit count for the serial data may be reset. For example, referring to FIG. 2, the control unit 230 may reset the bit count to zero.

At step 470, a second update signal may be provided when the bit count again reaches the predefined number N. For example, referring to FIG. 2, the control unit 230 may provide the second update signal to the second output unit 250B and the second delay unit 240B when the count reaches ten bits.

At step 475, a second set of parallel data may be provided to the target component. For example, referring to FIG. 2, the second output unit 250B may receive and store the N bits of parallel data from the N-bit shift register 220 based on receiving the second update signal. Further, the second output unit 250B may provide the second set of parallel data to the second N-bit bus 255B. In some embodiments, the second N-bit bus 255B may be coupled to a second portion (e.g., bits 11-20) of the input bus 260 of the target component 270. Alternatively, in some embodiments, the second output unit 250B may provide the second set of parallel data directly to the second portion of the input bus 260. In one or more embodiments, the second output unit 250B may be a 10 bit latch.

At step 480, the second set of parallel data may be processed by the target if it is associated with a received validity indicator. For example, referring to FIG. 2, the target component 270 may determine whether a second validity indicator has been received within a given time threshold of receiving the second set of parallel data. In one or more embodiments, the target component 270 may be configured to ignore the second set of parallel data if it is not associated with the received second validity indicator.

At step 485, the bit count for the serial data may be reset. For example, referring to FIG. 2, the control unit 230 may again reset the bit count to zero. After step 485, the sequence 400 returns to step 450 to continue processing the serial data. Stated differently, steps 450-485 may be repeated as needed to complete the processing of a received serial data transmission. Once the serial data transmission is completely processed, the sequence 400 ends.

Figure 5:
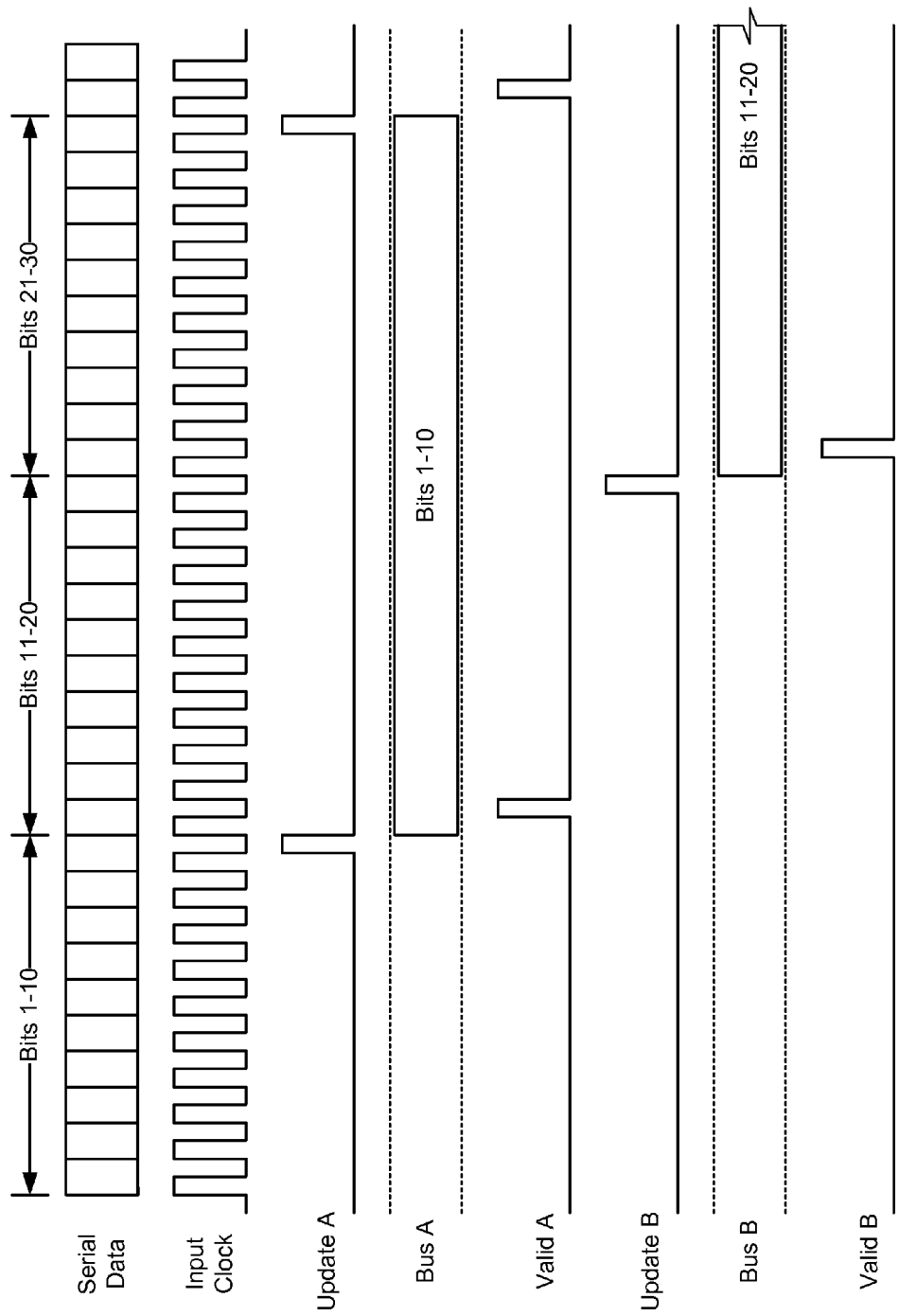
FIG. 5 is an example timing diagram in accordance with one or more embodiments.

Referring to FIG. 5, an example is shown in accordance to some embodiments. Specifically, FIG. 5 may correspond to an example in which the target component 270 (shown in FIG. 2) is a processor having a twenty bit input bus 260.

As shown in FIG. 5, the input clock signal ("Input Clock") includes pulses corresponding to the bits of the received serial data ("Serial Data"). In this example, the control unit 230 (shown in FIG. 2) is configured to alternate between providing the first and second update signals based on counting to N=10. Accordingly, as shown, the first update signal from the control unit 230 ("Update A") includes a first pulse corresponding to counting the first set of ten bits of the serial data. Further, the second update signal from the control unit 230 ("Update B") includes a first pulse corresponding to counting the second set of ten bits of the serial data (i.e., after a total of twenty bits). In addition, the first update signal includes a second pulse corresponding to counting the third set of ten bits of the serial data (i.e., after a total of thirty bits).

In this example, a first ten-bit bus ("Bus A") may correspond generally to the first N-bit bus 255A shown in FIG. 2. Further, a second ten-bit bus ("Bus B") may correspond generally to the second N-bit bus 255B shown in FIG. 2. As shown, in response to the first pulse of the first update signal, the first ten-bit bus may carry a first set of parallel data (e.g., bits 1-10) until the second pulse of the first update signal. Further, in response to the first pulse of the second update signal, the second ten-bit bus may carry a second set of parallel data (e.g., bits 11-20) until a second pulse (not shown) of the second update signal.

In some embodiments, the first ten-bit bus may provide bits 1-10 to a first portion of the twenty bit input bus 260 of the target component 270. Further, in some embodiments, the second ten-bit bus may provide bits 11-20 to a second portion of the twenty bit input bus 260 of the target component 270.

In one or more embodiments, a validity signal may be obtained by delaying an update signal by a predefined period of time (e.g., using delay unit 240A shown in FIG. 2). Accordingly, as shown in FIG. 5, the first validity signal ("Valid A") includes a first pulse occurring a period of time after the first pulse of the first update signal. Further, the first validity signal also includes a second pulse occurring a period of time after the second pulse of the first update signal. Furthermore, the second validity signal ("Valid B") includes a pulse occurring a period of time after the pulse of the second update signal.

In this example, the target component 270 receives the first pulse of the first validity signal and the first set of parallel data (e.g., bits 1-10) within a given time threshold. In one or more embodiments, the target component 270 may determine that the first validity signal is associated with the first set of parallel data, and may thus process the first set of parallel data. Similarly, the target component 270 may determine that the second validity signal is associated with the second set of parallel data, and may thus process the second set of parallel data.

Figure 6:
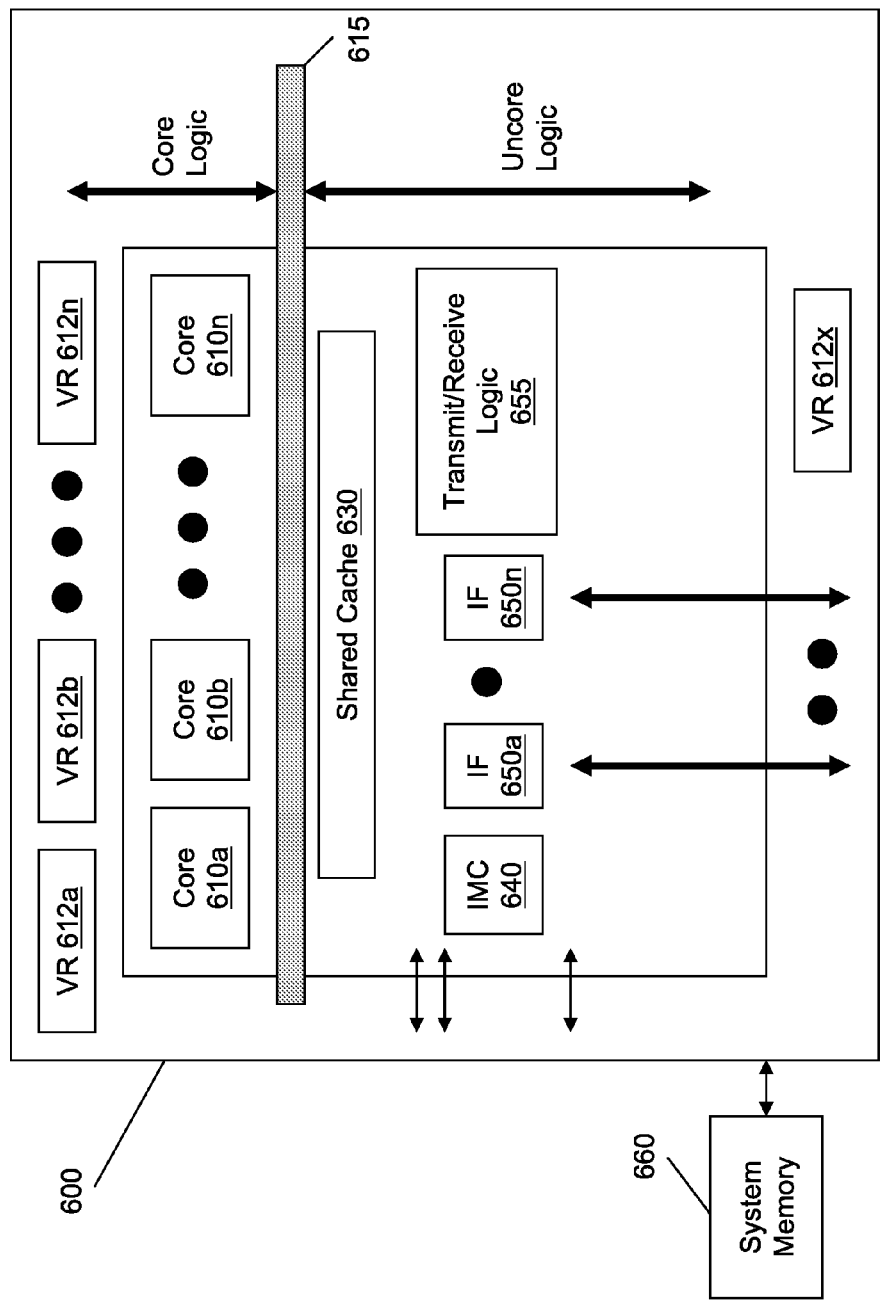
FIG. 6 is a block diagram of a processor core in accordance with one or more embodiments.

Referring now to FIG. 6, shown is a block diagram of a processor in accordance with one or more embodiments. As shown in FIG. 6, processor 600 may be a multicore processor including a plurality of cores 610a-610n. Each core may be associated with a corresponding voltage regulator 612a-612n. The various cores may be coupled via an interconnect 615 to an uncore logic that includes various components. As seen, the uncore logic may include a shared cache 630 which may be a last level cache. In addition, the uncore logic may include an integrated memory controller 640, various interfaces 650 and transmit/receive logic 655.

In one or more embodiments, transmit/receive logic 655 may include all or a portion of the receive logic 200 described above with reference to FIG. 2. Thus, the transmit/receive logic 655 may enable the cores 610a-610n to synchronize or align data transfer with other components (e.g., components included in a mobile computing device).

With further reference to FIG. 6, processor 600 may communicate with a system memory 660, e.g., via a memory bus. In addition, by interfaces 650, connection can be made to various off-chip components such as peripheral devices, mass storage and so forth. While shown with this particular implementation in the embodiment of FIG. 6, the scope of the various embodiments discussed herein is not limited in this regard.

Figure 7:
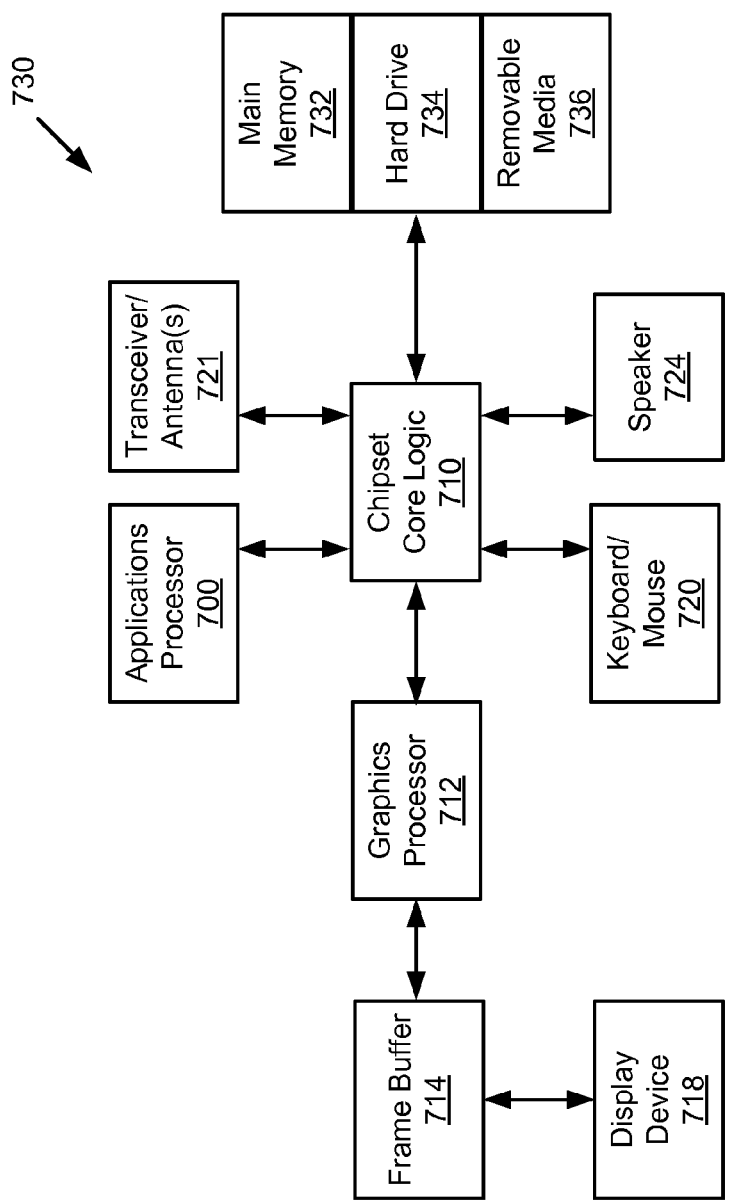
FIG. 7 is a block diagram of an example system in accordance with one or more embodiments.

Embodiments may be used in many different environments. Referring now to FIG. 7, shown is a block diagram of a computer system 730 with which embodiments can be used. The computer system 730 may include a hard drive 734 and a removable storage medium 736, coupled by a bus (shown as an arrow) to a chipset core logic 710. A keyboard and/or mouse 720, or other conventional components, may be coupled to the chipset core logic.

The core logic may couple to the graphics processor 712, and the applications processor 700 in one embodiment. The graphics processor 712 may also be coupled to a frame buffer 714. The frame buffer 714 may be coupled to a display device 718, such as a liquid crystal display (LCD) touch screen. In one embodiment, the graphics processor 712 may be a multi-threaded, multi-core parallel processor using single instruction multiple data (SIMD) architecture.

The chipset logic 710 may include a non-volatile memory port to couple to the main memory 732. Also coupled to the core logic 710 may be a radio transceiver and antenna(s) 721, 722. Speakers 724 may also be coupled to core logic 710.

Figure 8:
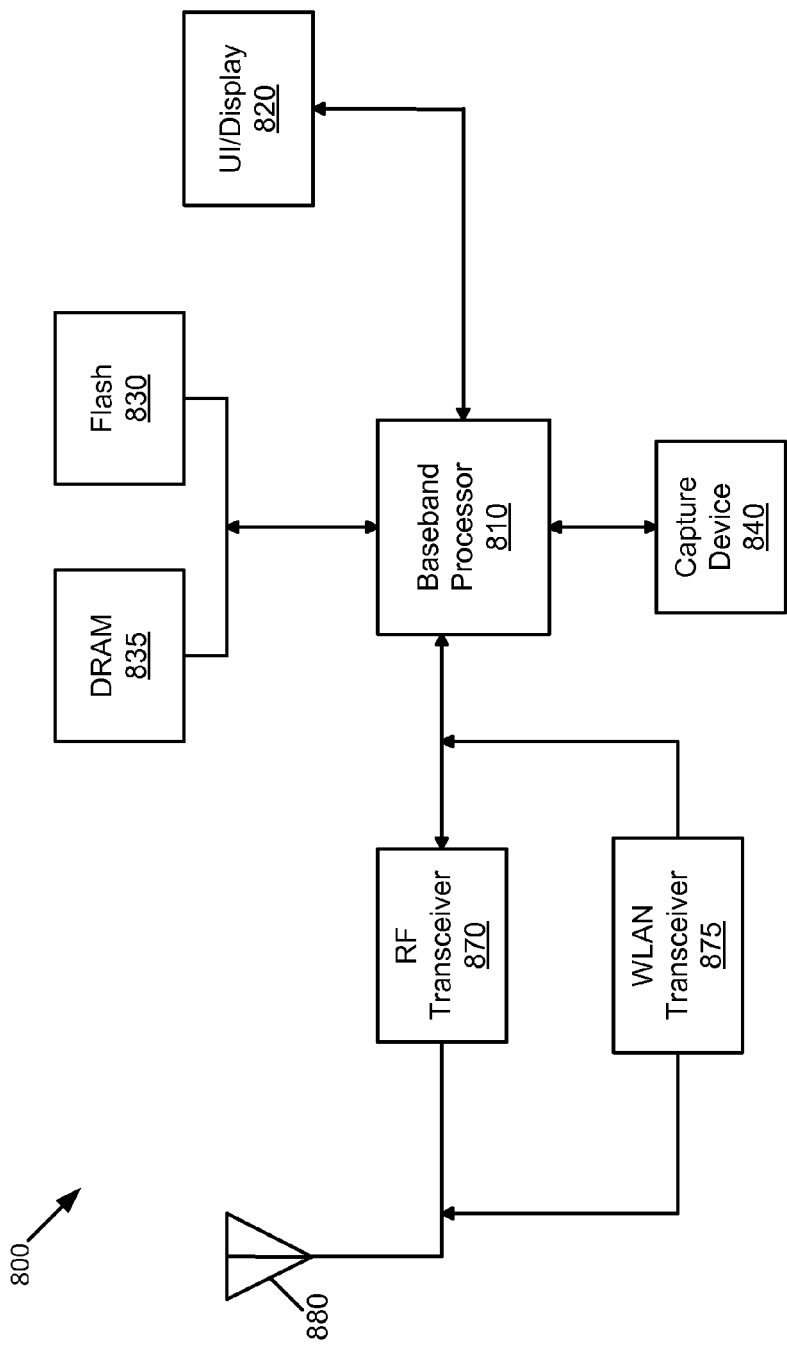
FIG. 8 is a block diagram of an example system in accordance with one or more embodiments.

Referring now to FIG. 8, shown is a block diagram of an example system 800 with which embodiments can be used. As seen, system 800 may be a smartphone or other wireless communicator. As shown in the block diagram of FIG. 8, system 800 may include a baseband processor 810 which may be a multicore processor that can handle both baseband processing tasks as well as application processing. Thus baseband processor 810 can perform various signal processing with regard to communications, as well as perform computing operations for the device. In turn, baseband processor 810 can couple to a user interface/display 820 which can be realized, in some embodiments by a touch screen display. In addition, baseband processor 810 may couple to a memory system including, in the embodiment of FIG. 8 a non-volatile memory, namely a flash memory 830 and a system memory, namely a dynamic random access memory (DRAM) 835. As further seen, baseband processor 810 can further couple to a capture device 840 such as an image capture device that can record video and/or still images.

To enable communications to be transmitted and received, various circuitry may be coupled between baseband processor 810 and an antenna 880. Specifically, a radio frequency (RF) transceiver 870 and a wireless local area network (WLAN) transceiver 875 may be present. In general, RF transceiver 870 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 875, local wireless signals, such as according to a Bluetooth™ standard or an IEEE 802.11 standard such as IEEE 802.11a/b/g/n can also be realized. Although shown at this high level in the embodiment of FIG. 8, understand the scope of the present invention is not limited in this regard.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments. One example embodiment may be an apparatus including: a de-serializer to convert serial data into a first set of parallel data and a second set of parallel data; a target component comprising an input bus, the input bus including a first portion and a second portion; a control unit to provide a first update signal and a second update signal based on a bit count of the serial data; a first output unit to provide the first set of parallel data to the first portion of the input bus; and a second output unit to provide the second set of parallel data to the second portion of the input bus. The apparatus may further include a first delay unit to provide a first validity indicator to the target component, wherein the first validity indicator is based on the first update signal. The target component may be to ignore the first set of parallel data unless it is associated with the first validation indicator. The first delay unit may be to provide the first validity indicator by delaying the first update signal by a predefined delay period. The apparatus may further include a second delay unit to provide a second validity indicator to the target component, wherein the second validity indicator is based on the second update signal. The target component may be to ignore the second set of parallel data unless it is associated with the second validation indicator. The second delay unit may be to provide the second validity indicator by delaying the second update signal by a predefined delay period. The apparatus may further include an input unit to provide the serial data to the de-serializer based on pulse width modulated (PWM) signals. The input unit may also be to determine a clock signal based on the serial data. The input unit may include an amplifier. The PWM signals may conform to the Mobile Industry Processor Interface (MIPI) M-PHY Specification. The control unit may be to provide the first update signal based on reaching the bit count of N. The control unit, after providing the first update signal, may also be to reset the bit count, and is to provide the second update signal based on again reaching the bit count of N. The first output unit and the second output unit may be N-bit latches. The de-serializer may be an N-bit shift register. The first output unit may be to store the first set of parallel data in response to the first update signal. The second output unit may be to store the second set of parallel data in response to the second update signal. The control unit may include a flip-flop (FF) and an N-bit counter. The first portion of the input bus may include N bits, the second portion of the input bus may include N bits, and the input bus may include 2N bits.

Another example embodiment may be a system including: a system on a chip comprising at least one core having at least one execution unit and receiver logic, the receiver logic including a de-serializer to convert serial data into a first set of parallel data and a second set of parallel data; a first output unit to provide the first set of parallel data to a first portion of an input bus of the at least one core based on a bit count of the serial data; and a second output unit to provide the second set of parallel data to a second portion of the input bus of the at least one core based on the bit count of the serial data. The system may also include a wireless device coupled to the system on the chip via an interconnect, the interconnect used to communicate data between the wireless device and the receiver logic of the system on the chip. The receiver logic may further include a control unit to alternatively provide a first update signal and a second update signal based on the bit count of the serial data. The receiver logic may further include a first delay unit to provide a first validity indicator based on the first update signal; and a second delay unit to provide a second validity indicator based on the second update signal. The at least one core may be to process the first set of parallel data when associated with the first validity indicator, and to process the second set of parallel data when associated with the second validity indicator.

A further example embodiment may be a method including: de-serializing serial data to obtain two parallel data streams of width N; for every N bits of the serial data, providing one of the two parallel data streams to a target component in alternating fashion; and for every N bits of the serial data, providing a validation indicator to validate the one of the two parallel data streams. The method may also include using the one of the two parallel data streams only if the one of the two parallel data streams is associated with the validation indicator. The method may also include: receiving the one of the two parallel data streams at a first time; receiving the validation indicator at a second time; and determining whether the one of the two parallel data streams is associated with the validation indicator based on the first time and the second time.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments for the sake of illustration, those skilled in the art will appreciate numerous modifications and variations therefrom. It is intended that the appended claims cover all such modifications and variations as fall within the true spirit and scope of this present invention.

What is claimed is:

1. An apparatus comprising:
   a de-serializer to convert serial data into a first set of parallel data and a second set of parallel data;
   a target component comprising an input bus, the input bus including a first portion and a second portion;
   a control unit to provide a first update signal and a second update signal based on a bit count of the serial data;
   a first output unit to provide the first set of parallel data to the first portion of the input bus; and
   a second output unit to provide the second set of parallel data to the second portion of the input bus.

2. The apparatus of claim 1, further comprising a first delay unit to provide a first validity indicator to the target component, wherein the first validity indicator is based on the first update signal.

3. The apparatus of claim 2, wherein the target component is to ignore the first set of parallel data unless it is associated with the first validity indicator.

4. The apparatus of claim 2, wherein the first delay unit is to provide the first validity indicator by delaying the first update signal by a predefined delay period.

5. The apparatus of claim 1, further comprising a second delay unit to provide a second validity indicator to the target component, wherein the second validity indicator is based on the second update signal.

6. The apparatus of claim 5, wherein the target component is to ignore the second set of parallel data unless it is associated with the second validity indicator.

7. The apparatus of claim 5, wherein the second delay unit is to provide the second validity indicator by delaying the second update signal by a predefined delay period.

8. The apparatus of claim 1, further comprising an input unit to provide the serial data to the de-serializer based on pulse width modulated (PWM) signals.

9. The apparatus of claim 8, wherein the input unit is also to determine a clock signal based on the serial data.

10. The apparatus of claim 8, wherein the input unit comprises an amplifier.

11. The apparatus of claim 8, wherein the PWM signals are to conform to the Mobile Industry Processor Interface (MIPI) M-PHY Specification.

12. The apparatus of claim 1, wherein the control unit is to provide the first update signal based on reaching the bit count of N.

13. The apparatus of claim 12, wherein the control unit, after providing the first update signal, is to reset the bit count, and is to provide the second update signal based on again reaching the bit count of N.

14. The apparatus of claim 1, wherein the first output unit and the second output unit are N-bit latches.

15. The apparatus of claim 1, wherein the de-serializer is an N-bit shift register.

16. The apparatus of claim 1, wherein the first output unit is to store the first set of parallel data in response to the first update signal.

17. The apparatus of claim 1, wherein the second output unit is to store the second set of parallel data in response to the second update signal.

18. The apparatus of claim 1, wherein the control unit comprises a flip-flop (FF) and an N-bit counter.

19. The apparatus of claim 1, wherein the first portion of the input bus comprises N bits, wherein the second portion of the input bus comprises N bits, and wherein the input bus comprises 2N bits.

20. A system comprising:
    a system on a chip comprising at least one core having at least one execution unit and receiver logic, the receiver logic comprising:
       a de-serializer to convert serial data into a first set of parallel data and a second set of parallel data;
       a first output unit to provide the first set of parallel data to a first portion of an input bus of the at least one core based on a bit count of the serial data;
       a second output unit to provide the second set of parallel data to a second portion of the input bus of the at least one core based on the bit count of the serial data; and
    a wireless device coupled to the system on the chip via an interconnect, the interconnect used to communicate data between the wireless device and the receiver logic of the system on the chip.

21. The system of claim 20, wherein the receiver logic further comprises a control unit to alternatively provide a first update signal and a second update signal based on the bit count of the serial data.

22. The system of claim 21, wherein the receiver logic further comprises:
    a first delay unit to provide a first validity indicator based on the first update signal; and
    a second delay unit to provide a second validity indicator based on the second update signal.

23. The system of claim 22, wherein the at least one core is to process the first set of parallel data when associated with the first validity indicator, and wherein the at least one core is to process the second set of parallel data when associated with the second validity indicator.

24. A method comprising:
    de-serializing serial data to obtain two parallel data streams of width N;
    for every N bits of the serial data, providing one of the two parallel data streams to a target component in alternating fashion;
    for every N bits of the serial data, providing a validation indicator to validate the one of the two parallel data streams; and
    using the one of the two parallel data streams only if the one of the two parallel data streams is associated with the validation indicator.

25. The method of claim 24, further comprising:
    receiving the one of the two parallel data streams at a first time;
    receiving the validation indicator at a second time; and
    determining whether the one of the two parallel data streams is associated with the validation indicator based on the first time and the second time.

* * * * *